Jan. 7, 1969 J. G. KREN ET AL 3,419,956
TECHNIQUE FOR OBTAINING ISOLATED INTEGRATED CIRCUITS
Filed Jan. 21, 1966
FIG. 1
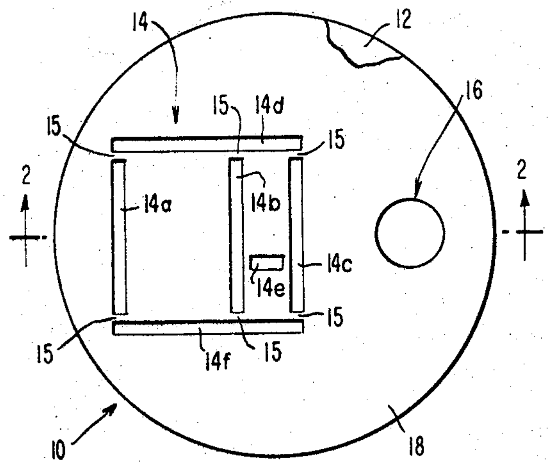
FIG. 5
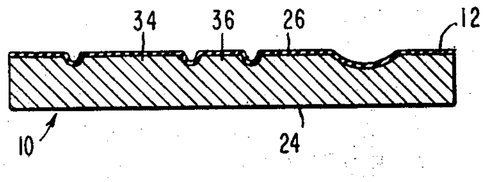
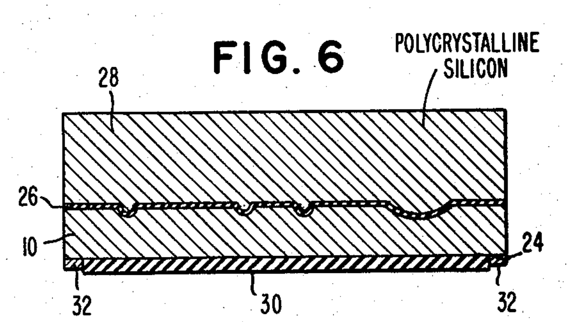
FIG. 2
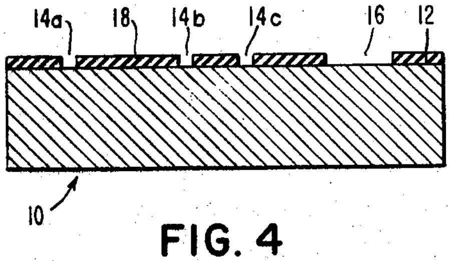
FIG. 4
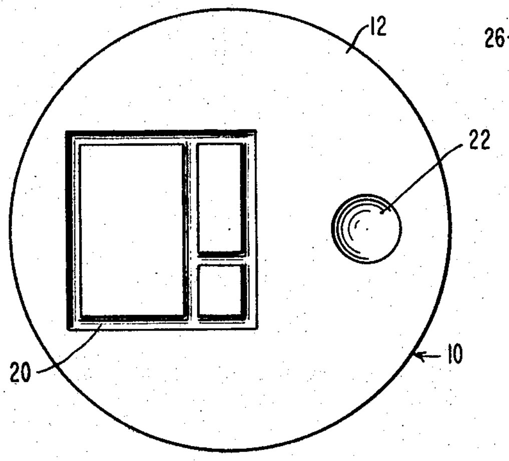
FIG. 7
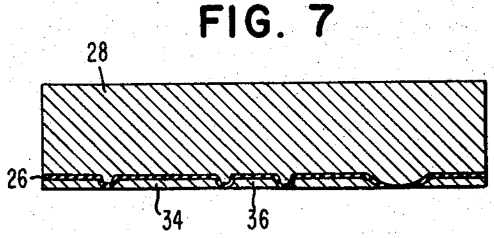
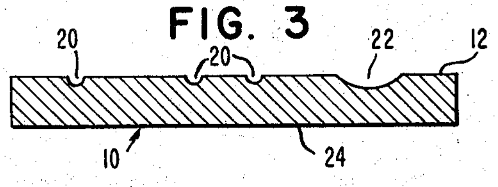
INVENTORS
JOHN C. KREN
JOSEPH REGH
DAVID K. SETO
BY
ATTORNEY United States Patent Office 3,419,956
Patented Jan. 7, 1969

3,419,956
TECHNIQUE FOR OBTAINING ISOLATED INTEGRATED CIRCUITS

John G. Kren, Port Ewen, Joseph Regh, Wappingers Falls, and David K. Seto, La Grangeville, N.Y., assignors to International Business Machines Corporation, Armonk, N.Y., a corporation of New York Filed Jan. 21, 1966, Ser. No. 522,278
U.S. Cl. 29—578 11 Claims
Int. Cl. H01l 5/00

ABSTRACT OF THE DISCLOSURE

A process of fabricating semiconductor devices according to which isolation channels are produced at the surface of a semiconductor wafer by forming a masking layer for the selective etching of the surface, the masking layer having a plurality of openings in a line pattern including junctions at which the line segments meet, thereafter forming an oxide layer on the surface and into the isolation channels in order to isolate the "device islands" of semiconductor material. Uniformity in the depth of etching of the isolation channels is realized by forming discontinuities in the openings in said masking layer at the junction of the line segments so that when the etching of the surface is performed the semiconductor material underlying the discontinuities is removed.

This invention relates to semiconductor circuitry, and more particularly, to a technique of forming integrated or solid state semiconductor circuits.

From the very beginning of the revival of interest in semiconductors, which followed the development of the transistor, much effort has been directed to the attainment of miniaturized or microelectronic circuitry incorporating solid state devices in complex arrangements. Although semiconductor devices themselves had been scaled down to miniscule sizes on the order of several mils, that is, thousandths of an inch, in dimensions, complete circuit configurations have not kept pace in scaling down to the ultimate in miniaturization. Printed circuits and other techniques have been employed in the past in the attempt to achieve reasonably high packing densities in the formation of circuits utilizing semiconductor devices. Only very recently, however, have the so-called integrated approaches to device fabrication and to the connecting of such devices in various circuit configurations become practicable.

Some of the approaches to device and circuit fabrication that have been lumped under the heading of "integrated" are those in which, for example, the devices themselves are produced quite conventionally by sequential diffusion steps involving the diffusion of several desired impurity materials into a semiconductor wafer, followed by the dicing or cutting up of the semiconductor wafer into single or multiple device "chips." These "chips" are then secured to a circuit board or module and are connected in complex arrays by known printed circuit techniques. The passive components, such as resistors, required for the circuit configuration, are for example, simply provided by deposition of suitable resistive material on the module. Similarly, other desired passive components are formed on the module.

The most advanced form of integrated circuitry that has been proposed is the so-called monolithic form. Such an approach envisions the embodying of great numbers of devices, be they passive or active, in a block or monolith of semiconductor material. Generally all of the active and passive components are left in place within the monolith and by predetermined judicious selection and interconnection of simple circuit configurations for performing given functions, such as AND/OR logic, vast complex circuit arrangements such as are involved in a computer may be realized within a small volume.

Although the foregoing circuit complexes may be produced as indicated, for the ultimate in high-speed operation of such circuits with reliability and reproducibility it becomes highly desirable that the individual circuit elements be completely electrically isolated from each other since, as noted, all of the devices are contained within a common block or monolith of semiconductor material and hence, comprise a single physical unit.

Accordingly, it is a primary object of the present invention to realize completely the aforesaid advantages of monolithic integrated circuitry by a improvement in the technique of providing the needed isolation between the individual components in such integrated circuitry.

Previous proposals for taking advantage of monolithic integrated designs have attempted to solve the problem of electrically isolating individual components by means such as diffusion of an isolation region within the monolith or by interposing an insulating material in an etched out groove extending through the entire monolith of semiconductor material. It has also been proposed that the required isolation be achieved by etching channels in the top surface of a semiconductor wafer, and by thereafter forming an oxide layer in these etched channels to produce an insulative configuration which results in isolated islands of monocrystalline material in which the required devices may subsequently be formed.

It is therefore another object of the present invention to improve upon the last-named technique of creating isolated islands suitably insulated from each other by an oxide layer.

An additional object is to introduce controls over the etching procedure so as to insure that uniformity will be achieved in the depth of etching of the channels prior to forming the insulating oxide layer.

A further object is to achieve uniformity in the etching of the islands of monocrystalline material at the final stage of the processing.

In order to provide some background material for the techniques herein discussed, reference may be had to: Electronic Design; June 22, 1964; pp. 80–81, Solid State Design; January 1965, pp. 29–34, Trans. of I.E.E.E. on Electron Devices; January 1965, pp. 20–25, Electronic News; Feb. 1, 1965.

Briefly considered, the context or environment in which the present invention is operative is a process where a pattern is etched into one surface of a wafer, typically of silicon. On this surface so-called window-frame channels are first formed. The isolation pattern is re-exposed at a later time by etching away the opposite surface of the wafer. Isolation is achieved by having previously deposited an oxide of silicon into the channels and also on the pattern surface of the wafer thereby to surround the "active islands". An earlier growth of polycrystalline silicon serves as a supporting substrate for the island structure.

The depth of the channels determines the thickness of the isolated silicon islands. These channels are usually etched to a depth of 5 to 25 microns. The success of this configuration depends on the ability to etch the channels to a precision of ±1 micron followed by an etching of the opposite surface to expose the channels, also by ±1 micron, over the entire surface of a silicon single crystal wafer.

To the end that the aforesaid results be achieved simply and effectively, the present invention, considered in its several features, involves the formation of "gaps" at the corners and junctions in the photolithographic pattern, and the etching pattern resulting the reform. These "gaps" serve to prevent undesired etching of the wafer surface and to insure uniformity in the depth of the isolation channels therein.

Another feature of the present invention resides in the use of a wider channel, adjacent to the regular device-isolating channels. This wider channel etches deeper than the regular channels and serves as a channel depth gauge.

Another feature of the present invention involves the formation of a peripheral ridge on the single crystal wafer surface during the growth of the polycrystalline support material to obtain later the desired uniformity of etching, i.e. planar etching of the single crystal surface.

The foregoing and other objects, features and advantages of the invention will be apparent from the following more particular description of preferred embodiments of the invention, as illustrated in the accompanying drawings.

FIGS. 1 through 7 illustrate various stages of manufacture of a semiconductor unit in accordance with the technique of the present invention.

Considering now the technique of the present invention, and referring to FIGS. 1–7 of the drawings, there is illustrated in FIG. 1 a top view of a semiconductor wafer 10 having on its upper surface 12 etching channel patterns 14 and 16 which are produced by opening up areas in an oxide layer employing photoresist techniques well known to those skilled in the art. Thus, the upper surface 12 has been previously coated completely with a layer 18 of oxide. In the case of the selection of silicon as the semiconductor material, this surface has had formed thereon a layer of $SiO_2$. The desired channel pattern 14 is accomplished by placing a photoresist coating over the oxide coating to mask all the oxide area except where etching of the oxide is desired. The additional circular channel 16 is also formed in the oxide layer 18. The separate sections of the line pattern 14 are designated **14*a*, 14*b*, 14*c*, 14*d*, 14*e* and 14*f*. Thus, the oxide coating 18 is retained on the upper surface 12 except in the patterns 14 and 16**, at which areas it has been removed by the application typically of an HF solution following the removal of the overlying photoresist layer at these areas.

The wafer 10 which has initially been sliced and lapped and selected to be about 14 mils in original thickness, has been chemically etched to reduce the thickness to between 7 and 8 mils. The surface 12 is polished to a surface finish of about 1 micron for most of its area (i.e. flatness is not essential to this process as the two surfaces will be made parallel in a later step). The oxide layer 18, as shown in FIG. 2, is about ½ to 1 micron in thickness as formed on the wafer surface 12.

Following the photo-etching techniques described above, a chemical solution such as 5:2:1 mixture of nitric, acetic and hydrofluoric acid, respectively, is used to etch the silicon preferentially at the openings in the oxide layer 18 to produce the depression 20 and 22, as shown in FIGS. 3 and 4.

Referring back to FIG. 1, it will be seen that "gaps" 15 were provided in the etching pattern 14, that is, the separate line portions **14*a*–14*f* were not allowed to come together and the oxide was left at these "gaps." However, since the above noted chemical solution for etching the semiconductor body of silicon etches in all directions, a closed pattern is formed, that is, the pattern of etched depressions or channels 20 in the wafer surface 12**, as shown in FIGS. 3 and 4, is a continuous one.

The above described procedure for etching the channels 20, thereby to obtain electrical isolation, is directed to achieving initial uniform etching depths which are of prime importance to attaining the fundamental objectives of the present invention. Were it not for the procedure described, the etching depths would be deeper at the points where the line segments in the pattern meet or cross, but with the eching barrier, that is, the "gaps" 15, which have been provided, there is effectively a means present to prevent a faster etching rate at these points. Where a channel depth, for example, of approximately 0.5 mil is sought, a barrier "gap" of 0.15 mil is required Referring now to FIG. 3, it will be seen that the oxide layer 18 has been removed from the upper surface. It will also be noted that in FIG. 3 the depression 22, which results from etching the surface 12 at the previously formed opening 16, is slightly deeper than the channels 20. This deeper depression 22 can be used as a channel depth gauge later in the processing.

As shown in FIG. 3, the thickness of the wafer 10 has been further reduced to a thickness of approximately 3 to 4 mils. This has been accomplished by mounting the wafer 10 on a flat polishing block with the channel-etched surface 12 toward the block. The mounting is accomplished by pressing the wafer 10 flat onto the glue-covered block surface. The surface 24 of the wafer 10 is precision-lapped to a ½ micron flatness and parallelness tolerance.

The above described procedure for precision lapping of wafer surface 24, is directed to achieving uniform wafer thickness without a necessary flatness which is of prime importance to attaining the fundamental objectives of the present invention. Were it not for the procedure described, a uniform thickness of material to be removed between the bottoms of channels 20 and 22 and surface 24 would not be available and the purposes of uniform channel etch and uniform chemical polish for channel exposure would be defeated.

After dismounting and cleaning, the channel-etched surface 12 of the wafer 10 is coated with a layer 26 of a silicon oxide, such as $SiO_2$, formed by well-known procedures, to a thickness of about 3 microns. The first portion of layer 26 is formed by thermal oxidation of about ½ micron thickness and completing its thickness by vapor deposition of the $SiO_2$. This prevents the thin active silicon layer 34 and 36, shown in FIG. 5, from becoming damaged. The coating of the surface 12 includig the depressions 20 and 22 with the layer 26 is also illustrated in FIG. 5.

Referring now to FIGS. 6 and 7, there are shown the additional steps following the formation of the oxide layer 26. A layer 28 of polycrystalline silicon is formed over the oxide layer 26. This is accomplished by using one of many techniques available for the deposition of silicon upon a substrate. Such a process, for example, may involve the reduction of silicon tetrachloride. The lower surface 24 which has been lapped and oxidation protected is shielded during the deposition step by a quartz disc 30 of a slightly smaller diameter than the wafer 10. This allows a rim or ridge 32 of silicon to be deposited on the surface 24.

The original wafer 10 which forms a portion of the structure of FIG. 6 is now etched with hydrofluoric acid followed with a chemical solution such as 5:2:1 mixture of nitric, acetic and hydrofluoric acid, respectively, or 95:5 mixture of nitric and hydrofluoric acid, respectively, the quartz disc 30 having been removed. The ridge 32 of silicon prevents an effect which is normally encountered when a rotating cup etch is used. That is to say, the surface which is being etched would normally become convex and the outside edges would become rounded such that the eventual exposure of the isolation oxide would not be uniform. However, by having this ridge 32 of silicon the lower surface 24 is etched in planar fashion. This ridge 32, if found to be undesirable in the final configuration, can be removed by ultrasonic cutting or grinding off the periphery.

As indicated, the original wafer 10 is etched down until the isolating or insulating oxide layer 26 is reached at its lowermost point. This etching step is performed in a rotating Teflon cup of approximately twice the diameter of the wafer 10 and with a strong etch until the circle pattern, that is, the portion of the oxide coating 26 in the depression 22, becomes exposed. A weaker etch is then utilized to bring out the completed isolation pattern. Wafer 10, during this etch, is mounted with black wax onto a quartz disc such as to etch only surface 24. This yields a more uniform planar etch. Thus, as is illustrated in FIG. 7, the deeper portion of the oxide layer 26 will be broken through and the oxide portions which are not as deep will then just be reached by the weaker etch. The monocrystalline regions 34 and 36 as shown in FIG. 7 are now completely isolated from each other and are ready for conventional further processing in making the desired integrated devices within these islands.

While the invention has been particularly shown and described with reference to preferred embodiments thereof, it will be understood by those skilled in the art that various changes in form and details may be made therein without departing from the spirit and scope of the invention.

What is claimed is:

1. In a proces of fabricating semiconductor devices comprising the steps of (a) providing a monocrystalline semiconductor wafer, (b) forming a masking layer for the selective etching of a surface of said wafer, said masking layer having a plurality of openings in a line pattern including junctions at which line segments meet, (c) etching said surface of the semiconductor wafer in said previously-established line pattern to produce isolation channels, (d) forming an oxide layer on said surface and into said isolation channels, (e) growing semiconductor material over said previously formed oxide layer, (f) removing the material of the original monocrystalline wafer from its reverse side to the level of the oxide formed in said isolation channels, whereby isolated islands of monocrystalline material separated by said oxide layer are produced, and forming devices in said isolated islands, the improvement which comprises forming discontinuities in the openings in said masking layer at the junctions of said line segments, so that when the etching of said surface is performed the semiconductor material underlying the discontinuities is removed, thereby to produce isolation channels of uniform depth in the continuous line pattern desired.

2. A process as defined in claim 1, wherein said masking layer is an oxide layer adherent to the surface of the semiconductor wafer, further comprising the steps of;

forming another opening of circular pattern in said oxide layer adjacent to but spaced from said line pattern, the diameter thereof being substantially greater than the width of the line segments in said line pattern, etching the surface in said previously-established line pattern and in said circular pattern to produce isolation channels in a continuous pattern on said surface an a circular depression of greater depth than the depth of said isolation channels, and forming an oxide layer on said surface and into both said isolation channels and said circular depression.

3. A process as defined in claim 2, wherein said wafer is constituted of silicon and said oxide layer is $SiO_2$.

4. A process as defined in claim 2, wherein said grown layer is constituted of polycrystalline silicon.

5. A process as defined in claim 2, wherein said isolation pattern is etched into a surface of said wafer using a mixture of nitric, acetic and hydrofluoric acids in the proportions 5:2:1.

6. A process as defined in claim 2, wherein said removal of said original monocrystalline wafer is accomplished by first etching with a strong etch until the level of said oxide layer in the circular depression in said wafer is reached and then etching with a weaker etch to the level of the portions of said oxide layer formed in said isolation channels.

7. A process of fabricating semiconductor devices comprising the steps of, forming an oxide layer over one surface of a semiconductor wafer, forming two separate patterns of openings in said oxide layer, the first comprising a plurality of line segments in a discontinuous pattern, the discontinuities being constituted by the oxide material at the junctions of said line segments, and the second pattern comprising a circular opening of substantial diameter compared to the width of said line segments, etching at the openings thus formed in said oxide layer to form a continuous isolation channel pattern of uniform depth in said surface completely surrounding selected portions of semiconductor material at said surface and to form a circular depression in said surface, removing the oxide layer in which the pattern of openings for the etching of the surface has been produced, reducing the thickness of said wafer to approximately 3 to 4 mils by lapping down the opposite surface of said wafer to a one-half micron flatness, coating the one surface including all of the previously formed depressions therein with a layer of silicon oxide, growing a layer of semiconductor material over said silicon oxide layer and growing a peripheral ridge of semiconductor material on the opposite surface of said wafer, etching down said opposite surface until the oxide layer present in the isolation channels is exposed, and forming a plurality of devices in the islands of monocrystalline material which are separated by said oxide layer.

8. A process as defined in claim 7, wherein said wafer is constituted of silicon and said oxide layer is $SiO_2$.

9. A process as defined in claim 7, wherein said grown layer is constituted of polycrystalline silicon.

10. A process as defined in claim 7, wherein said isolation pattern is etched into a surface of said wafer using a mixture of nitric, acetic and hydrofluoric acids in the proportions 5:2:1.

11. A process as defined in claim 7, wherein said removal of said original monocrystalline wafer is accomplished by first etching with a strong etch until the level of said oxide layer is reached in the circular depression, deeper than said pattern in said wafer, and then using a weaker etch to reach the level of the portions of said oxide layer formed in said isolation channels.

References Cited

UNITED STATES PATENTS

| | | | |
|---|---|---|---|
| 2,967,344 | 1/1961 | Mueller | 29—578 |
| 3,108,359 | 10/1963 | Moore et al. | 29—589 |
| 3,140,527 | 7/1964 | Valdman et al. | 29—580 |
| 3,179,543 | 4/1965 | Marcelis | 156—11 |
| 3,244,555 | 4/1966 | Adam et al. | |
| 3,290,753 | 12/1966 | Chang | 29—577 |

OTHER REFERENCES

"SCP and Solid State Technology," March 1965, page 45.

WILLIAM I. BROOKS, *Primary Examiner.*

U.S. Cl. X.R.

29—580; 148—1.5; 156—8, 17